(12) United States Patent
Lee et al.

(10) Patent No.: US 8,205,145 B2
(45) Date of Patent: Jun. 19, 2012

(54) HIGH-SPEED ADD-COMPARE-SELECT (ACS) CIRCUIT

(75) Inventors: Seok-Jun Lee, Allen, TX (US); Yuming Zhu, Plano, TX (US); Manish Goel, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 896 days.

(21) Appl. No.: 12/265,011

(22) Filed: Nov. 5, 2008

(65) Prior Publication Data

US 2009/0089556 A1 Apr. 2, 2009

Related U.S. Application Data

(63) Continuation-in-part of application No. 10/322,876, filed on Dec. 18, 2002, now abandoned.

(51) Int. Cl.
*H03M 13/00* (2006.01)
(52) U.S. Cl. ........................................ 714/796
(58) Field of Classification Search .......... 714/786–792, 714/794–799
See application file for complete search history.

(56) References Cited

U.S. PATENT DOCUMENTS

| | | | |
|---|---|---|---|
| 4,606,027 A | 8/1986 | Otani | |
| 4,777,636 A | 10/1988 | Yamashita et al. | |
| 5,448,583 A | 9/1995 | Miyamoto et al. | |
| 5,450,338 A * | 9/1995 | Oota et al. | 708/200 |
| 5,509,021 A | 4/1996 | Todoroki | |
| 5,923,713 A * | 7/1999 | Hatakeyama | 375/341 |
| 5,940,416 A | 8/1999 | Nishiya et al. | |
| 5,946,361 A * | 8/1999 | Araki et al. | 375/341 |
| 2003/0194025 A1* | 10/2003 | Vasquez | 375/341 |
| 2003/0194026 A1* | 10/2003 | Vasquez | 375/341 |
| 2004/0117721 A1 | 6/2004 | Parhi | |
| 2004/0120427 A1 | 6/2004 | Lee et al. | |
| 2004/0122883 A1* | 6/2004 | Lee et al. | 708/490 |
| 2004/0243916 A1* | 12/2004 | Kim et al. | 714/796 |
| 2004/0255230 A1* | 12/2004 | Chen et al. | 714/796 |
| 2007/0113161 A1* | 5/2007 | Lingam et al. | 714/796 |

OTHER PUBLICATIONS

Lee et al., "Area-Efficient High-Throughput MAP Decoder Architectures", Transactions on VLSI Systems, vol. 13, No. 8 (IEEE, Aug. 2005), pp. 921-933.
"16-bit Carry-select Adder", Field Programmable Gate Array Application Note (Atmel, Sep. 1999).

* cited by examiner

*Primary Examiner* — Nadeem Iqbal
(74) *Attorney, Agent, or Firm* — Steven A. Shaw; W. James Brady; Frederick J. Telecky, Jr.

(57) ABSTRACT

A high speed add-compare-select (ACS) circuit for a Viterbi decoder or a turbo decoder has a lower critical path delay than that achievable using a traditional ACS circuit. According to one embodiment of the invention, the path and branch metrics are split into most-significant and least-significant portions, such portions separately added in order to reduce the propagation delay.

6 Claims, 9 Drawing Sheets

US 8,205,145 B2

HIGH-SPEED ADD-COMPARE-SELECT (ACS) CIRCUIT

CROSS-REFERENCE TO RELATED APPLICATIONS

This application is a continuation-in-part of copending application Ser. No. 10/322,876, filed Dec. 18, 2002.

STATEMENT REGARDING FEDERALLY SPONSORED RESEARCH OR DEVELOPMENT

Not applicable.

BACKGROUND OF THE INVENTION

This invention relates generally to decoder circuitry. More particularly, this invention relates to a high speed add-compare-select (ACS) circuit useful in Viterbi and "turbo" decoders.

A Viterbi decoder performs an optimum decoding of convolutionally encoded digital sequences. It is widely used in digital communication systems with data rates ranging from few kbps in narrowband applications to several hundreds of Mbps in broadband applications like Wireless LAN.

As shown in FIG. 1, a Viterbi decoder 100 is comprised of three units: a branch-metric computation unit (BMU) 102, an add-compare select unit (ACSU) 104 and a survivor path memory unit (SMU) 106. The input data is used in the BMU 102 to calculate the set of branch metrics for each new time step. These metrics are then fed to the ACSU 104 that accumulates the branch metrics recursively as path metrics according to the trellis determined by a convolutional encoder polynomial. The SMU 106 processes the decisions being made in the ACSU 104 and outputs an estimated path, with a latency of trace-back depth.

It is clear that ACSU 104 and SMU 106 architectures depend only on the trellis and hence these two units are independent of the application for which a Viterbi decoder is being used. The application specific computations are done in the BMU 102 according to soft input definition; and the interpretation of the decoded path into data at the output of the SMU 106 is also dependent upon the output format definition. Since the application specific parts of a Viterbi decoder are mainly found at the input and output, the high speed architecture of ACSU 104 can be generally applicable.

If a high speed Viterbi decoder needs to be implemented for broadband applications with greater than 100 Mbps data rates, the critical path of a Viterbi decoder must be minimized. By looking at the block diagram of a Viterbi decoder 100 in FIG. 1, it is obvious that the BMU 102 as well as the SMU 106 are purely feedforward and the throughput can easily be increased by massive pipelining. However, this does not hold for the ACSU 104.

One way to improve the throughput of ACSU 104 is to apply a look-ahead scheme (radix-4 architecture) to the trellis 200 as shown in FIG. 2. A radix-4 architecture achieves a double data rate without increasing the clock rate because a radix-4 architecture can run at the clock rates employed by a radix-2 architecture. The circuit complexity associated with a conventional radix-4 architecture is greater however, as can be seen with reference to FIG. 3a and FIG. 4, where a conventional radix-4 ACSU 400 basically requires 2-stage comparison circuits including 4 more adders and 2 more multiplexers than that required by a conventional radix-2 ACSU 300 shown in FIG. 3a.

In view of the foregoing, it is both advantageous and desirable to provide an ACS circuit for a radix-4 Viterbi decoder that has a lower critical path delay than that achievable using a traditional ACS circuit suitable for use with a radix-4 Viterbi decoder. It is also advantageous and desirable to implement such a lower critical path delay without increasing the clock rate beyond that required by a radix-2 ACS circuit.

By way of further background, the term "turbo coding" is well-known in the art as referring to a technique of coding in which two or more convolutional codes are applied to the payload data. Turbo coding is commonly used in many communications applications, including cellular wireless communications according to the well-known GSM, CDMA, WCDMA, and Long-term-evolution (LTE) protocols. As known in the art, conventional Turbo encoding uses one convolutional encoder to encode the datastream in its original form, while the other encodes a pseudo-randomly interleaved version of the datastream. The results from the two encoders are interwoven (concatenated), either serially or in parallel, to produce an output encoded datastream that is then transmitted or otherwise communicated to the destination. Turbo coding involving parallel concatenation is often referred to as a parallel concatenated convolutional code (PCCC), while serial concatenation results in a serial concatenated convolutional code (SCCC). Upon receipt, turbo decoding involves first decoding the received sequence according to one of the convolutional codes, de-interleaving the result, then applying a second decoding according to the other convolutional code, and repeating this process multiple times.

FIG. 3b illustrates a conventional arrangement of a turbo decoder for a parallel concatenated convolutional code (PCCC), in which a first maximum a posterior (MAP) decoder $350_1$ receives the communicated data in the form of log-likelihood ratio (LLR) values for the system, or data, bits L(S), and also LLR values for the parity bits L(P1) from the first of the two convolutional codes. The system bits L(S) are de-interleaved by interleaver 360, according to the interleaving applied in encoding, and the result L(S') is applied to a second MAP decoder $350_2$, which decodes de-interleaved system bits L(S') and the LLR values of the parity bits L(P2) derived from the second convolutional code. As known in the art, MAP decoders $350_1$, $350_2$ operate iteratively with respect to one another, effectively providing "extrinsic" values applied to the inputs of each other for the next iteration. The decoded output Y is generated by decoder $350_1$ after a desired number of iterations.

Maximum a posterior (MAP) decoders 350 are conventionally arranged to generate LLR values by way of a "forward-backward" algorithm, generally implemented by way of a trellis structure, and typically operating in the log domain. FIG. 3c illustrates the construction of such a conventional decoder 350, which follows the MAP decoder architectures described in Lee et al., "Area-Efficient High-Throughput MAP Decoder Architectures", Transactions on VLSI Systems, Vol. 13, No. 8 (IEEE, August 2005), pp. 921-33, incorporated herein by this reference. In this architecture, decoder 350 includes γ unit 311, α unit 315, β unit 317, and Λ MPU (Metric Processing Unit) 309. γ unit 311 includes γ MPU units 308, which produces branch metric values, referred to in the art as the γ values, based on the received input values and versions of those values delayed by α delay line 313a and β delay line 313b; multiplexers 314 determine whether to apply the input value or the β-delayed value to the γ units 308 generating those γ values that are applied to β unit 317. α unit 315 includes α MPU 310, which computes a "forward" recursion value for an α(k) term at a sample point $s_k$, by applying a maximum function ("max*") to α(k−1) and γ(k−1) values from a sample point $s_{k-1}$. The γ values are also applied to β unit 317, which includes two β MPUs 312, in this example, and which performs "backward" recursion of a value for a β(k) term at the sample point $s_k$, from application of the max* function to β(k+1) and γ(k+1) values from a sample point $s_{k+1}$; the results of this backward recursion are stored in metric memory 318, as sequenced by multiplexer 316. A MPU 309 derives the LLR output values from the outputs of α unit 315 and β unit 317, as well as the original γ values from a delay line 313*a*.

In the arrangement of FIG. 3*c*, as well as in conventional turbo decoders, the trellis stages in the forward and backward recursion paths (α MPU 310 and β MPUs 312 of FIG. 3*c*), respectively, operate in a similar manner as in the Viterbi decoder, and as such may be implemented by add-compare-select stages. FIG. 3*d* illustrates construction of an add-compare-select "kernel" as used in α MPU 310 implemented in radix-2 fashion. A pair of adders $302_0$, $302_1$ receive the γ0 and γ1 values for the two paths into a particular trellis node (which correspond to the "branch metrics" of Viterbi decoding), along with respective α0 and α1 values for those two paths (which correspond to the "path metrics" of Viterbi decoding, in this case of forward metric "α" computation). Add-compare-select stage 310 also includes adder 304, which computes a difference between the sums output from adders $302_0$, $302_1$; those sums are also applied to multiplexer 306. The sign bit of the difference derived by adder 304, which in this two's complement implementation is merely the most-significant-bit of the difference, controls the selection made by multiplexer 306; as known in the art, for turbo decoding, the maximum of the two log sums generated by adders $302_0$, $302_1$ is selected. The difference generated by adder 304 is also applied to look-up table 305, which generates a correction factor for the max* operation, as known in the art. The sum selected by multiplexer 306 and this correction factor from LUT 305 are added by adder 307 to produce the new α value in this example.

As discussed above for the case of the Viterbi decoder, the critical path delay of the turbo decoder must be minimized in order to implement a high-speed turbo decoder for broadband applications requiring greater than 100 Mbps data rates. And as mentioned above for the Viterbi decoder, the throughput of the forward-backward trellis stages cannot be increased by massive pipelining of add-compare-select functions 310, 312, because these computations are not purely feedforward.

By way of further background, the "carry-select" adder is a well-known adder architecture, in which the addends are broken into sectors, and added on a sector-by-sector basis. The adder for each sector (other than the least significant sector) produces two sums—one sum assuming a carry-in of zero, and the other sum assuming a carry-in of one. The carry bit output from the next least significant sector controls a multiplexer to select the correct one of the two possible sums, based on the actual carry-in value produced by the next least significant sector.

BRIEF SUMMARY OF THE INVENTION

This invention is directed to a high speed add-compare-select (ACS) circuit for a Viterbi decoder, and for a turbo decoder for either a parallel concatenated convolutional code (PCCC) or a serial concatenated convolutional code (SCCC). This ACS has a lower critical path delay than that achievable using a traditional ACS circuit suitable for use with a Viterbi decoder or turbo decoder. The high speed ACS circuit is implemented to achieve a lower critical path delay.

According to one embodiment, a high speed add-compare-select circuit comprises a first plurality of adders configured to add a plurality of distinct metrics and generate a plurality of outputs therefrom; a second plurality of adders configured to generate a plurality of most significant bits in response to the plurality of outputs; control signal generation logic configured to determine at least one path metric in response to the plurality of most significant bits; and a selector element configured to generate the next path metric in response to the at least one path metric and further in response to the plurality of outputs.

According to another embodiment, a method of processing a plurality of distinct metrics and generating a subsequent path metric therefrom comprises the steps of providing a high speed add-compare-select (ACS) circuit, a branch metric computation unit, and a survivor path memory unit configured as a radix-4 Viterbi decoder having a radix-2 Viterbi clock rate; adding a plurality of distinct branch and path metrics and generating a plurality of outputs therefrom; generating a plurality of most significant bits in response to the plurality of outputs; determining a minimum or maximum path metric in response to the plurality of most significant bits; and generating the next path metric in response to the minimum or maximum path metric and further in response to the plurality of outputs, such that a data rate substantially twice that of a conventional radix-4 Viterbi decoder is achieved via the radix-2 Viterbi decoder clock rate.

According to another embodiment, a high-speed add-compare-select circuit and method of operating the same to process metrics and select a path metric breaks up the path and branch metrics into more significant and less significant portions. These portions of the metrics are summed with one another by way of adders in parallel, with propagation of the carry from the less significant portion delayed until a subsequent iteration. Evaluation logic receives the results from the parallel adders, and produce an output path metric constructed from the outputs of the parallel adders, based on analysis of the summed metric portions. The adder propagation delay in the add-compare-select circuit is thus reduced.

BRIEF DESCRIPTION OF THE SEVERAL VIEWS OF THE DRAWING

Other aspects and features of this invention and many of the attendant advantages of this invention will be readily appreciated as the same become better understood by reference to the following detailed description when considered in connection with the accompanying drawings wherein.

While the above-identified drawing figures set forth particular embodiments, other embodiments of this invention are also contemplated, as noted in the discussion. In all cases, this disclosure presents illustrated embodiments of this invention by way of representation and not limitation. Numerous other modifications and embodiments can be devised by those skilled in the art which fall within the scope and spirit of the principles of this invention.

DETAILED DESCRIPTION OF THE INVENTION

This invention will be described in connection with its preferred embodiment, namely as implemented into add-compare-select circuitry for decoders, such as those referred to, by class, as Viterbi decoders and as turbo decoders. This particular description is provided because it is contemplated that this invention will be particularly beneficial when applied to such a decoder and corresponding task. However, it is contemplated that this invention will also provided benefit in other applications, uses, and realizations. Accordingly, it is to be understood that the following description is provided by way of example only, and is not intended to limit the true scope of this invention as claimed.

Figure 4:
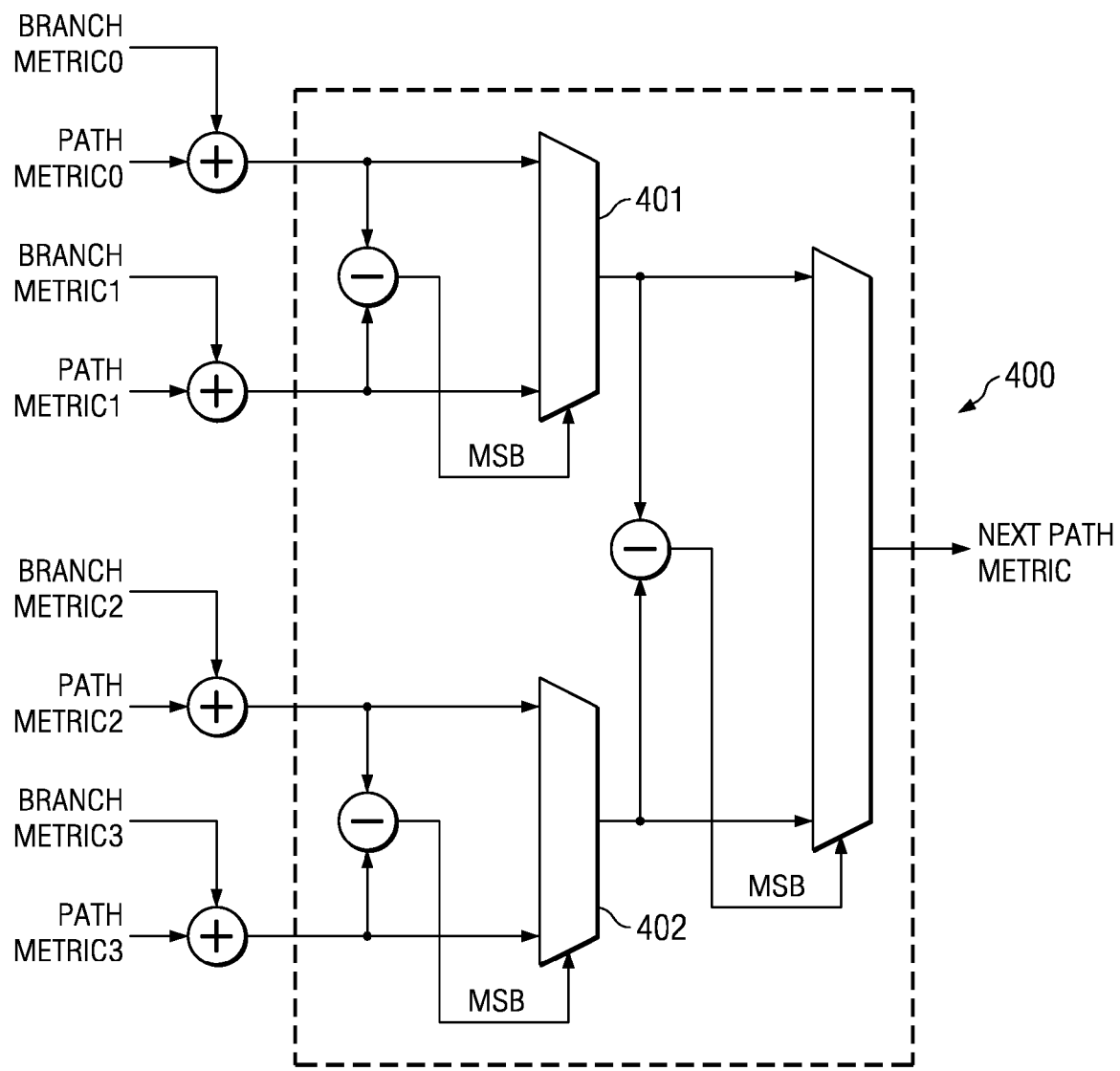
FIG. 4 is a circuit diagram illustrating a conventional radix-4 add-compare-select circuit.

Looking again at FIG. 4, a conventional add-compare-select (ACS) circuit 400 comprises two cascaded comparators 402, 404 in order to select one minimum or maximum path metric out of four possible candidates. This circuit 400 requires 7 adders, and has 3 adders and two multiplexers contributing to its critical path delay.

Figure 5:
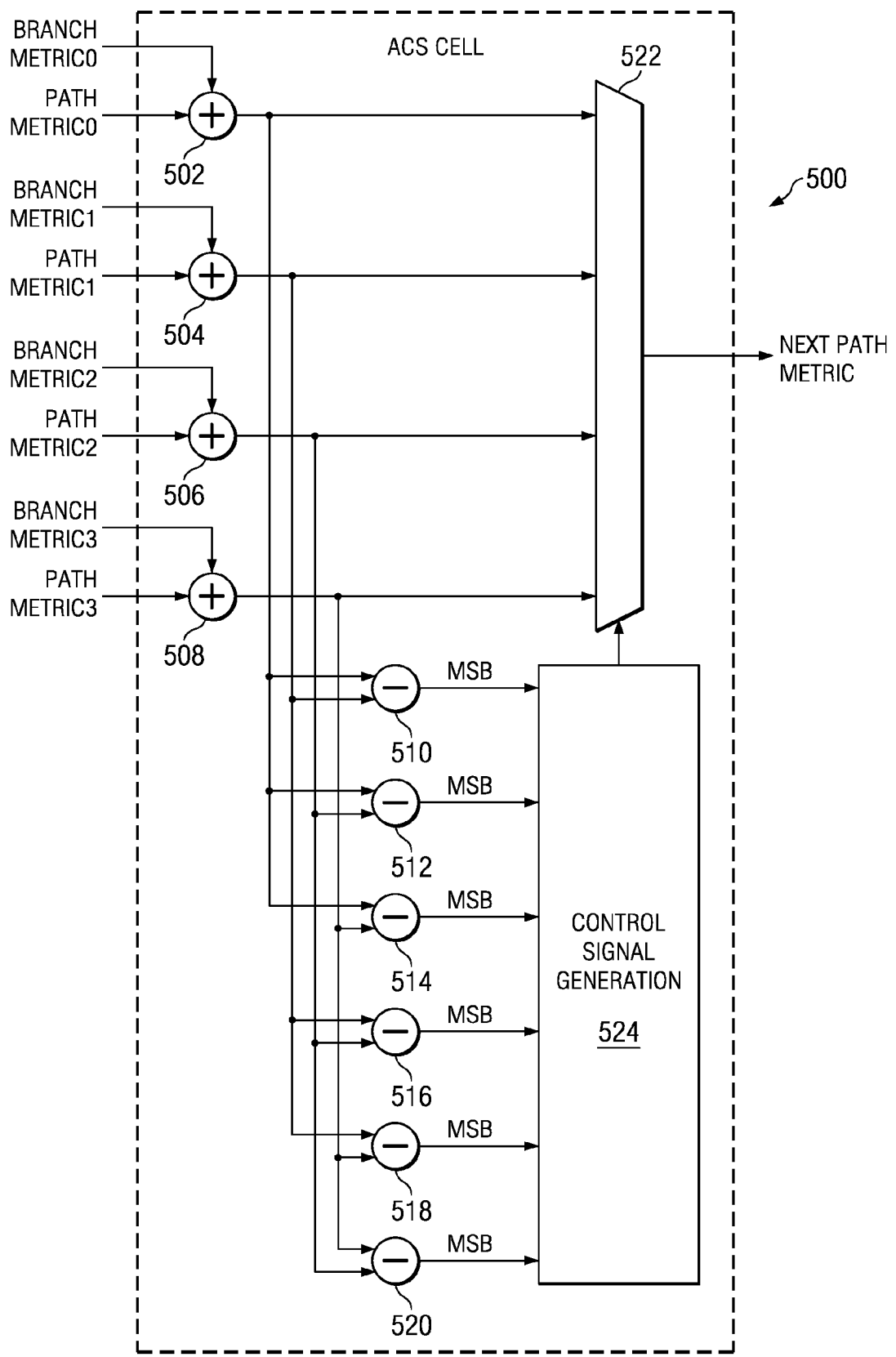
FIG. 5 is a circuit diagram illustrating a high speed add-compare-select circuit according to one embodiment of this invention.

FIG. 5 shows a high speed add-compare-select circuit 500 that employs 10 adders 502-520 and one 4-input multiplexer 522. At the cost of 3 more adders, it is intuitively obvious that the critical path delay is determined by 2 adders and a control signal generation block 524. Importantly, the logic delay of the control signal generation block 524 must be small because it determines the minimum or maximum path metric depending on 4 most significant bits (MSB) in the following manner. Assuming $$A = \text{path metric0} + \text{branch metric0}$$

$$B = \text{path metric1} + \text{branch metric1}$$

$$C = \text{path metric2} + \text{branch metric2}$$

$$D = \text{path metric3} + \text{branch metric3}$$

then $$X1 = \text{MSB}\{A-B\}$$

$$X2 = \text{MSB}\{A-C\}$$

$$X3 = \text{MSB}\{A-D\}$$

$$X4 = \text{MSB}\{B-C\}$$

$$X5 = \text{MSB}\{B-D\}$$

$$X6 = \text{MSB}\{C-D\}$$

where, MSB {A-B} operator is equal to the MSB of A-B; and it is also known that A is less than B if MSB {A-B} is equal to one. Thus, the 4-input multiplexer 522 requires the truth table described herein below.

If (X1=1 and X2=1 and X3=1), then A must be selected.
If (~X1=1 and X4=1 and X5=1), then B must be selected.
Else, if (~X2=1 and ~X4=1 and X6=1), then C must be selected.
Else, then D must be selected.

The control signal generation logic associated with ACS circuit 500 therefore reduces the critical path hardware requirements by one adder, desirably reducing the critical path delay.

Figure 6:
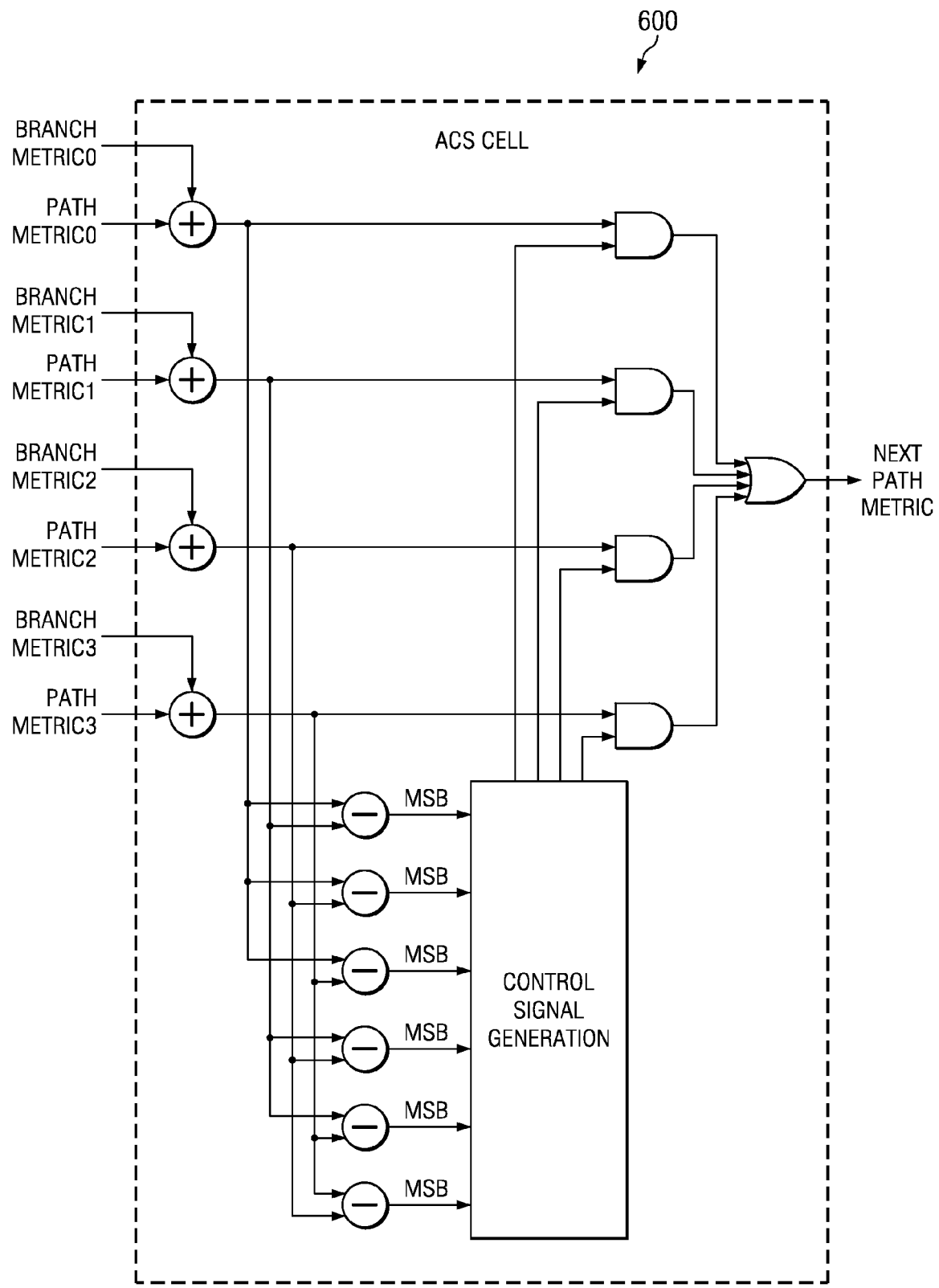
FIG. 6 is a circuit diagram illustrating a high speed add-compare-select circuit according to another embodiment of this invention.

FIG. 6 shows a high speed ACS circuit 600 according to another embodiment of this invention. ACS circuit 600 employs four 2-input AND gates and a 4-input OR gate instead of a 4-input multiplexer such as seen in high speed ACS circuit 500 discussed herein before. High speed ACS circuit 600 also reduces the ACS circuit critical path delay at the cost of three more adders and the control signal generation logic block 524.

This embodiment of the invention was implemented as a K=7 (64-state) Viterbi decoder using verilog language. The Viterbi decoder was then synthesized using a field programmable gate array (FPGA) to achieve the results shown in Table 1 below.

TABLE 1

Synthesis Results for Viterbi Decoder Using FPGA

Figure 1:
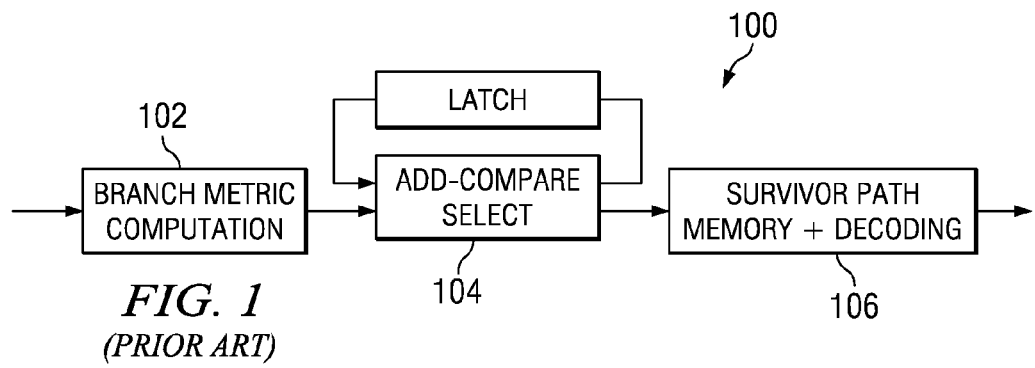
FIG. 1 is a system block diagram illustrating a conventional Viterbi decoder.
Figure 2:
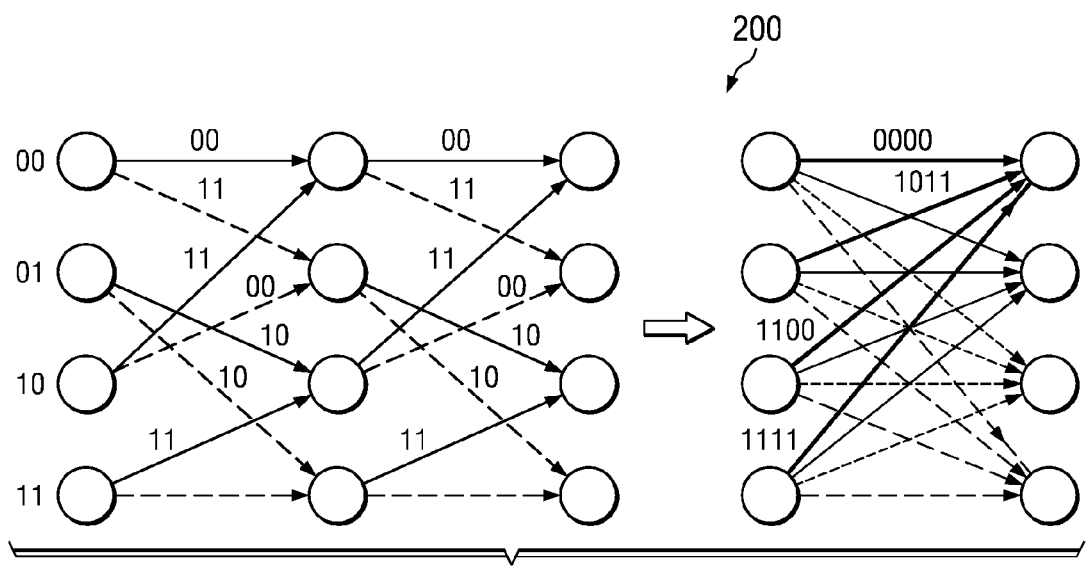
FIG. 2 is a diagram illustrating a radix-4 trellis for K=3,4 states.
Figure 3A:
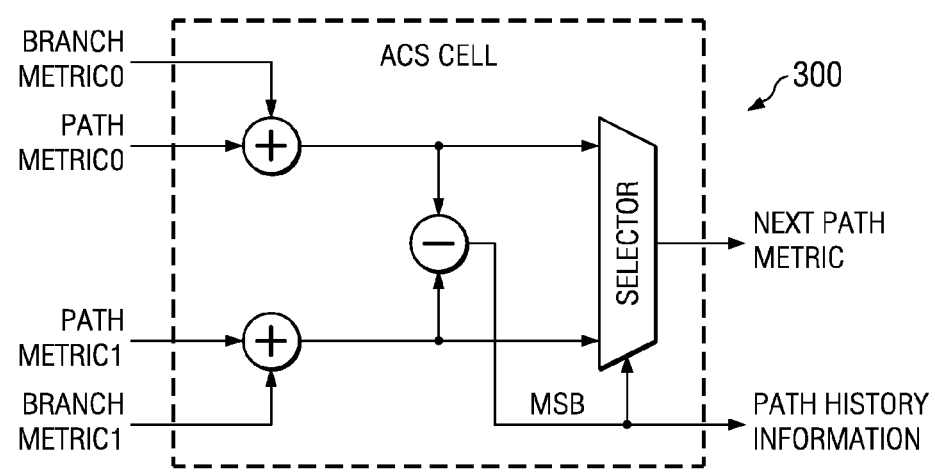
FIG. 3*a* is a circuit diagram illustrating a conventional radix-2 add-compare-select circuit.
Figure 3B:
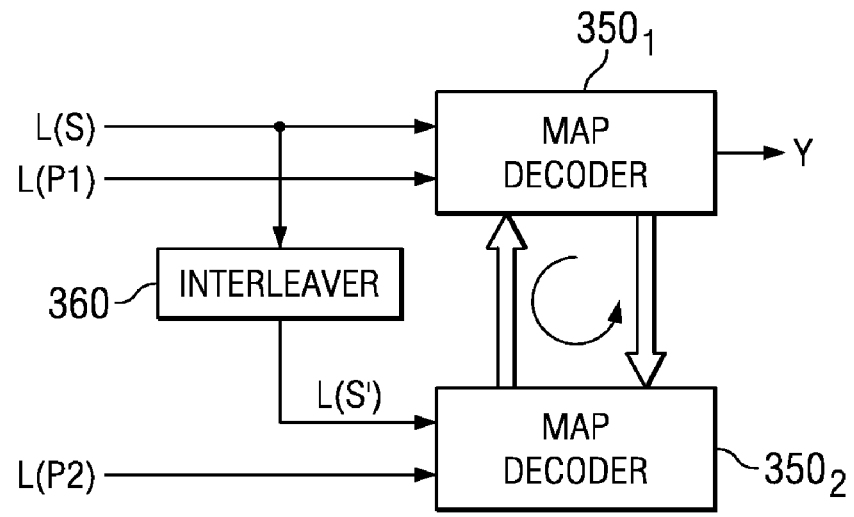
FIGS. 3*b* through 3*d* are circuit diagrams illustrating the construction of conventional turbo decoder circuitry.
Figure 3D:
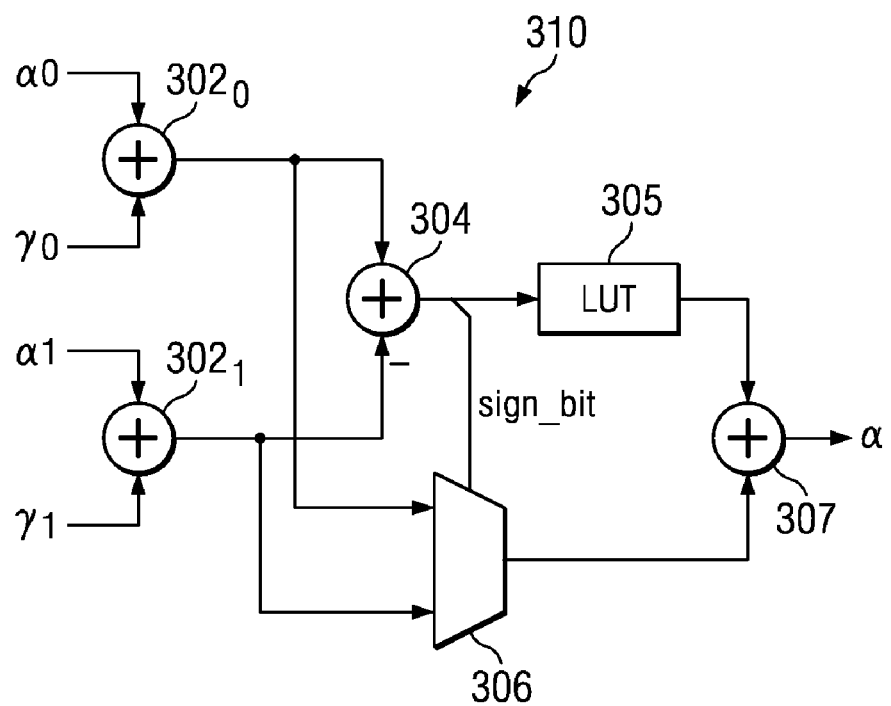
Figure 3C:
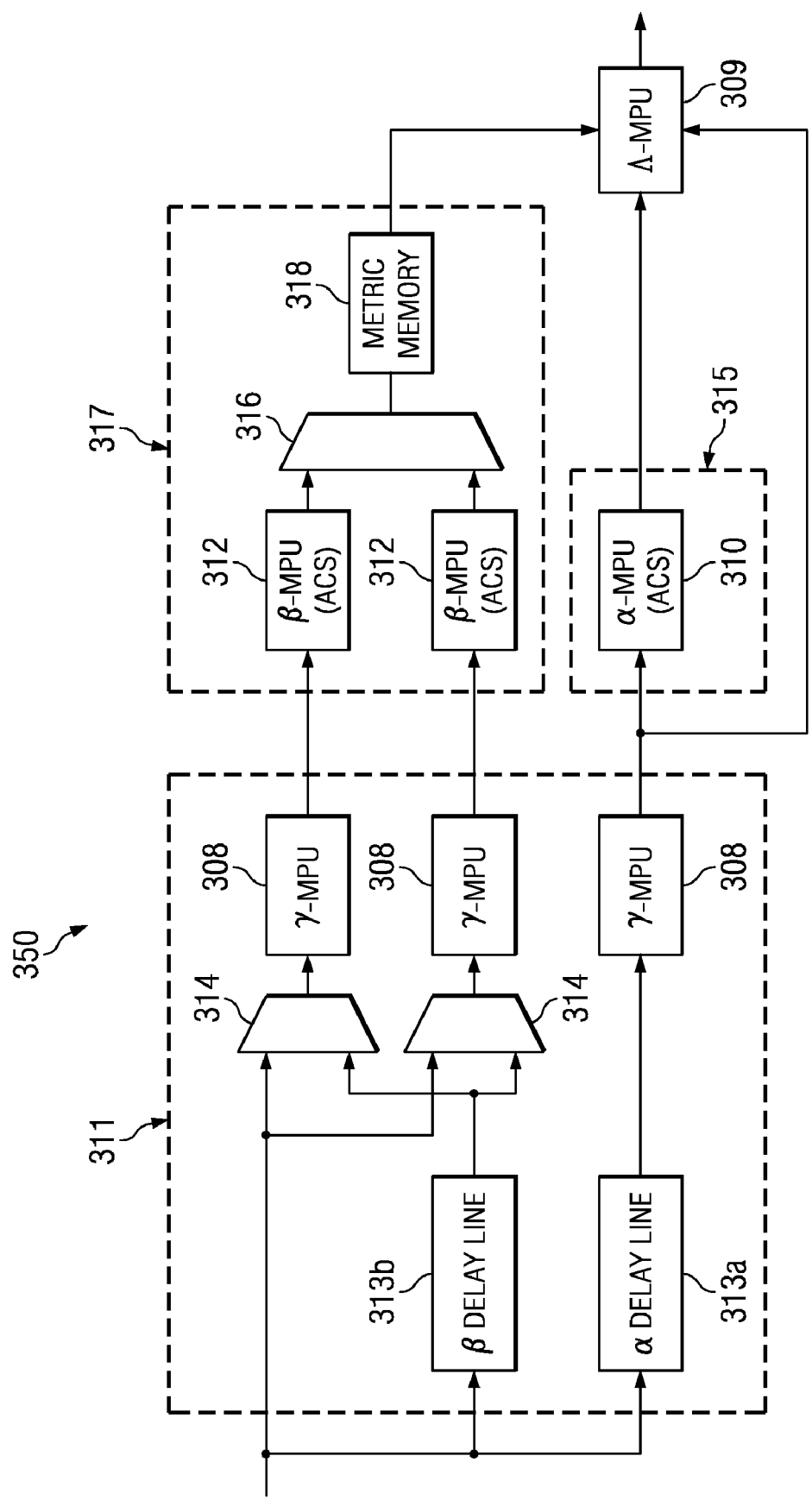

| Circuit | Speed after synthesis | Speed after place & route | Logic usages (number of used slices) |
|---|---|---|---|
| FIG. 1 | 81.5 MHz | 67.899 MHz | 30% |
| FIG. 2 | 91.9 MHz | 79.523 MHz | 36% |
| FIG. 3 | 91.9 MHz | 79.994 MHz | 39% |

In summary explanation of the above, a conventional radix-4 ACS circuit is reformulated to implement a high speed add-compare-select (ACS) circuit for a radix-4 Viterbi decoder. The high speed radix-4 Viterbi decoder ACS has a lower critical path delay than that achievable using a traditional ACS circuit suitable for use with a radix-4 Viterbi decoder. The high speed ACS circuit is implemented to achieve a lower critical path delay without increasing the clock rate beyond that required by a radix-2 ACS circuit.

In view of the above, it can be seen this invention presents a significant advancement in the art of Viterbi decoders. Further, this invention has been described in considerable detail in order to provide those skilled in the Viterbi decoding art with the information needed to apply the novel principles and to construct and use such specialized components as are required.

Further, in view of the foregoing descriptions, it should be apparent that this invention represents a significant departure from the prior art in construction and operation. However, while particular embodiments of this invention have been described herein in detail, it is to be understood that various alterations, modifications and substitutions can be made therein without departing in any way from the spirit and scope of this invention, as defined in the claims which follow. Since for example, the ACS architecture is not based on the particular encoder, and since only the ACS path recursion is dependent upon the trellis, the concepts discussed herein before with reference to particular ACS embodiments are applicable to ASIC and FPGA implementations of Viterbi decoders regardless of encoders employed.

According to another embodiment of the invention, the efficiency of selecting a path metric PM(n+1) for time step n+1 is further improved by breaking the candidate sums of path and branch metrics into most significant and least significant portions. The add-compare-select operation can be expressed as:

PM(n+1)=min[PM0(n)+BM0(n),PM1(n)+BM0(n)]

where PM0(n) is the path metric for path 0 from time step n; BM0(n) is the branch metric for path 0 from time step n; PM1(n) is the path metric for path 1 from time step n; and BM1(n) is the branch metric for path 1 from time step n. As known in the art, this operation can select either the minimum or the maximum of these sums to derive the next path metric PM(n+1). By way of example, this description will follow the approach of selecting the minimum of the candidate sums. It is contemplated, that those skilled in the art, having reference to this specification, will be readily able to adapt this description to instead select the maximum of the candidate sums, if desired; for example, determination of the maximum of candidate sums is commonly employed in turbo decoding. According to this embodiment of the invention, the candidate sums in this expression are reformulated into most-significant portions (_MSP) and least-significant portions (_LSP):

PM0=PM0(n)+BM0(n)={PM0_MSP(n)+BM0_MSP(n)+carry0(n),PM0_LSP(n)+BM0_LSP(n)} and

PM1=PM1(n)+BM1(n)={PM1_MSP(n)+BM1_MSP(n)+carry1(n),PM1_LSP(n)+BM1_LSP(n)} where the _MSP(n) and _LSP(n) designators refer to the most significant portion and least significant portion, respectively, of their corresponding operands. The carry0(n) and carry1(n) addends refer to the carry result from the sum of the _LSP(n) portions, and the { } indicates concatenation. The final selection of PM(n+1) in this example is thus expressed as:

PM(n+1)=min[PM0,PM1]

as before.

According to this embodiment of the invention, the propagation delay through the add-compare-select circuit is reduced by breaking the addends and sums into most-significant and least-significant portions in this manner. In conventional add-compare-select circuits, the maximum (worst case) propagation delay depends strongly upon the delay of the propagation of a carry from the sum of the least-significant bits to the most-significant bit. For example, if the path metrics PM are expressed as nine-bit binary values, the conventional add-compare-select circuit will have a propagation delay dominated by a series of nine full adder stages. In the conventional example of FIG. 3, the propagation delay amounts to ten full adder stages (one nine-bit full adder plus a single bit MSB adder) plus one multiplexer delay. In the conventional radix-4 example of FIG. 4, the propagation delay amounts to nineteen full adder stages (two nine-bit full adders plus an MSB adder) and two multiplexer delays. On the other hand, the reformulation of the add-compare-select according to this embodiment of the invention reduces the worst case adder propagation delay to that of the larger portion (in number of bits); for nine-bit path metric values, this propagation delay can be reduced to that of a five-bit delay.

Figure 7:
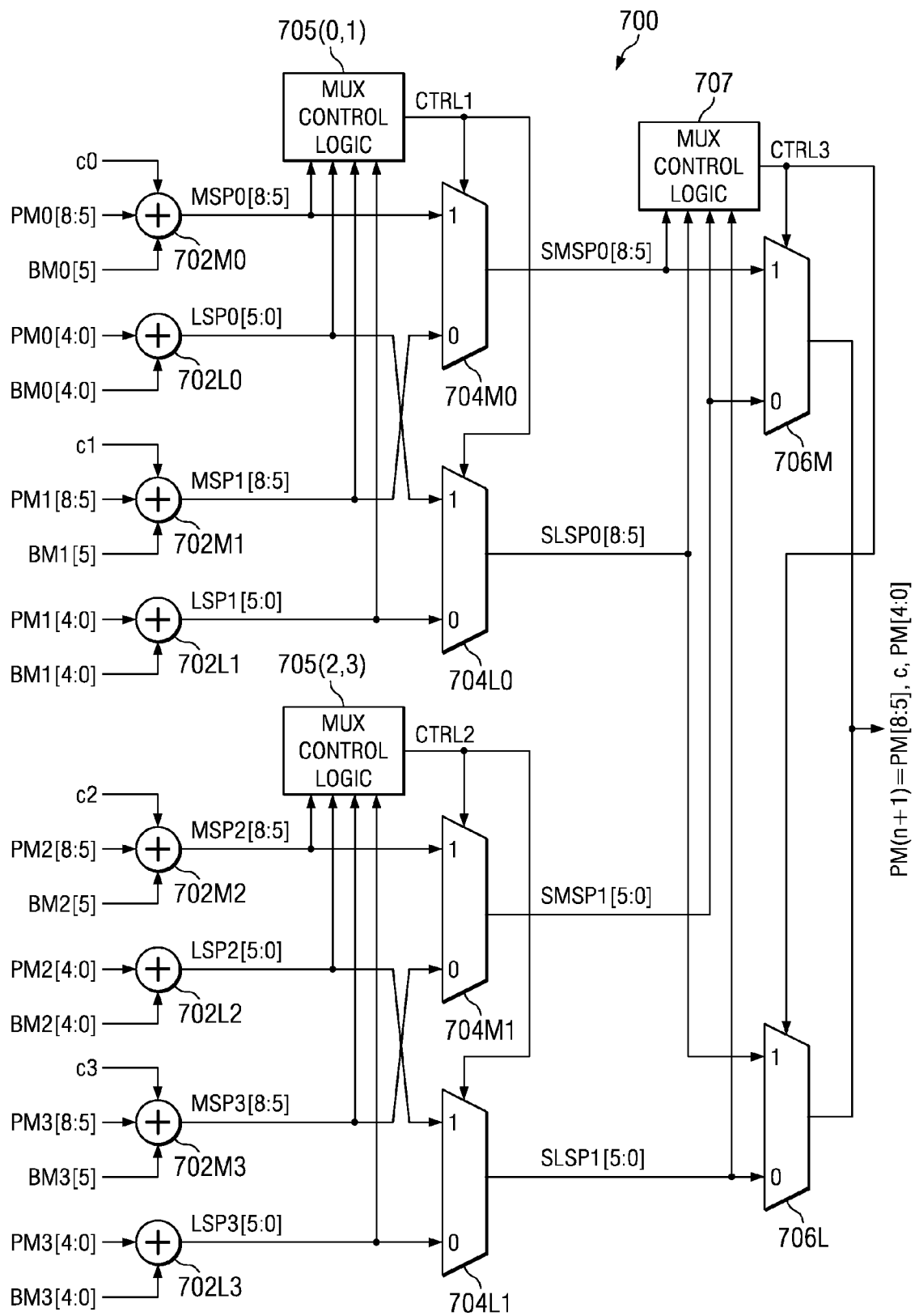
FIG. 7 is an electrical diagram, in block form, of a high-speed add-compare-select circuit according to another embodiment of this invention.

FIG. 7 illustrates add-compare-select stage 700 for carrying out this add-compare-select function according to this embodiment of the invention. This add-compare-select stage 700 can be used within a Viterbi decoder, such as that shown in the conventional arrangement of FIG. 1, in replacement of add-compare-select stage 104. In this radix-4 Viterbi decoder example shown in FIG. 7, the addends for time interval n include four path metrics PM0(n) through PM3(n), each expressed as a nine-bit value PMx[8:0], and four branch metrics BM0(n) through BM3(n), each expressed as a six-bit value BMx[5:0]. In the context of a Viterbi decoder, this radix-4 block is intended to select the minimum one of the four sums of each path metric PM0(n) through PM3(n) with its corresponding branch metric BM0(n) through BM3(n), with the result becoming the metric PM(n+1) for the most-likely decode path in the next time interval n+1. According to this embodiment of the invention, these sums are re-formulated into sums of portions of the addends as described generally above. More specifically, in this example, a most significant portion sum is the result of the addition of the most significant four bits PMx[8:5] of path metric PMx(n) with the most significant single bit BMx[5] of the corresponding branch metric BMx(n), along with a carry bit from the least significant portion of the path metric generated in the previous time interval. And a least significant portion sum is the result of the addition of the least significant five bits PMx[4:0] of path metric PMx(n) with the least significant five bits BMx[4:0] of the corresponding branch metric BMx(n).

In this embodiment of the invention, each of full adders 702 receive corresponding pairs of portions of path metrics PM0(n) through PM3(n), and corresponding branch metric BM0(n) through BM3(n). Adders 702 are arranged in pairs, with each pair associated with one of the potential sums PMx(n)+BMx(n). In this example in which the path metrics PMx(n) are nine-bit values, each pair includes the parallel arrangement of a four-bit full adder 702Mx generating a most-significant portion of the sum of PMx(n)+BMx(n), and a five-bit full adder 702Lx generating a least-significant portion of the sum of PMx(n)+BMx(n), including a carry-out bit. In each pair, the most-significant portion adder 702Mx also receives a carry-in bit from the least-significant portion sum of path metric PMx(n−1) in the previous time interval n−1.

More specifically, as shown in FIG. 7, the inputs of adder 702M0 receive most-significant portion PM0[8:5] of path metric PM0(n), most significant bit BM0[5] of branch metric BM0(n), and carry bit c0 generated from the sum of the least-significant portions that produced path metric PM0(n) during previous time interval n−1. In response to these inputs, adder 702M0 generates a four-bit output result MSP0[8:5] expressing the sum of the addends. Adder 702L0 has inputs receiving least-significant portion PM0[4:0] of path metric PM0(n) and least-significant portion BM0[4:0] of branch metric BM0(n), and produces a six-bit output LSP0[5:0] expressing the sum of the addends at its inputs, with the most-significant bit indicating a carry-out bit. Similarly, adder 702M1 has inputs receiving most-significant portion PM1[8:5] of path metric PM1(n), most significant bit BM1[5] of branch metric BM1(n), and carry bit c1 from the previous time interval, and produces a four-bit sum MSP1[8:5] at its output. Adder 702L1 has inputs receiving least-significant portion PM1[4:0] of path metric PM1(n) and least-significant portion BM1[4:0] of branch metric BM1(n), and produces a six-bit output LSP1[5:0] of the sum of its inputs, with a carry-out. Adder 702M2 has inputs receiving most-significant portion PM2[8:5] of path metric PM2(n), most significant bit BM2[5] of branch metric BM2(n), and carry bit c2, and produces a four-bit sum MSP2[8:5]. Adder 702L2 has inputs receiving least-significant portion PM2[4:0] of path metric PM2(n) and least-significant portion BM2[4:0] of branch metric BM2(n), and produces a six-bit output LSP2[5:0] of the sum of its inputs, with a carry-out. And adder 702M3 adds most-significant portion PM3[8:5] of path metric PM3(n), most significant bit BM3[5] of branch metric BM3(n), and carry bit c3 to produce sum MSP3[8:5], while adder 702L3 adds least-significant portion PM3[4:0] of path metric PM3(*n*) and least-significant portion BM3[4:0] of branch metric BM3(*n*), to produce sum LSP3[5:0], including a carry-out.

Multiplexers 704M0, 704L0, 704M1, and 704L1, select from among the sums that are output by adders 702, to produce candidate sums SMSP0[8:5], SLSP0[5:0], SMSP1[8:5], and SLSP[5:0], respectively. In this regard, multiplexer 704M0 has inputs receiving the most-significant portion sums MSP0[8:5] from adder 702M0 and MSP1[8:5] from adder 702M1, while multiplexer 704L0 has inputs receiving the least-significant sums LSP0[5:0] from adder 702L0 and LSP1[5:0] from adder 702L1. Multiplexers 704M0 and 704L0 are controlled in common by multiplexer control logic 705(0,1), which receives the four portion sums MSP0[8:5], MSP1[8:5], LSP0[5:0], and LSP1[5:0] at its inputs, and generates control signal CTRL1 that is applied to the control inputs of multiplexers 704M0, 704L0. As such, either both of multiplexers 704M0 and 704L0 select the "1" state (MSP0 [8:5] and LSP0[5:0]), or select the "0" state (MSP1[8:5] and LSP1[5:0]). Similarly, multiplexer 704M1 receives most-significant portion sums MSP2[8:5] from adder 702M2 and MSP3[8:5] from adder 702M3, and multiplexer 704L1 receives least-significant sums LSP2[5:0] from adder 702L3 and LSP3[5:0] from adder 702L3. Multiplexer control logic 705(2,3) generates control signal CTRL2 applied to the control inputs of multiplexers 704M0, 704L0, responsive to portion sums MSP2[8:5], MSP3[8:5], LSP2[5:0], and LSP3[5:0] at its inputs. The specific logic table applied by both instances of multiplexer control logic 705(0,1), 705(2,3), in selecting the minimum sum as a candidate for a new path metric, will be described in further detail below relative to FIGS. 8*a* and 8*b*, respectively.

The outputs of multiplexers 704M0 and 704M1 are connected to inputs of multiplexer 706M, while the outputs of multiplexers 704L0 and 704L1 are connected to inputs of multiplexer 706L. These outputs of multiplexers 704M0, 704M1, 704L0, 704L1 are also connected to inputs of multiplexer control logic 707, which controls multiplexers 706M, 706L in common with one another by way of control signal CTRL3, which is applied to the control inputs of multiplexers 706M, 706L. The outputs of multiplexers 706M, 706L represent a final path metric sum PM(n+1) in the form of a least-significant portion, a most-significant portion, and a carry-out bit c from the least-significant portion. The specific logic table applied by multiplexer control logic 707 will be described in detail below, relative to FIG. 8*c*.

In the overall operation of add-compare-select stage 700, upon receipt of a new group of path metrics PM0(*n*) through PM3(*n*) and corresponding branch metrics BM0(*n*) through BM3(*n*), along with the intermediate carry bits c0 through c3 from the previous time interval n−1, adders **702M*x* generate most-significant portion sums MSP0, MSP1, MSP2, MSP3 (each of four bits [8:5] in the example of FIG. 7), and adders 702L*x* generate least-significant portion sums LSP0, LSP1, LSP2, LSP3 (each of six bits [5:0], which includes a carry-out bit from the five-bit additions performed by adders 702L*x*). Most-significant portion sums MSP0, MSP1 are applied to inputs of multiplexer 704M0, while least-significant portion sums LSP0, LSP1 are applied to inputs of multiplexer 704L0. Multiplexer control logic 705(0,1) operates, based on the values of these portion sums MSP0, MSP1, LSP0, LSP1, to control multiplexers 704M0, 704L0 to select either the pair of portion sums MSP0, LSP0, or the pair of portion sums MSP1, LSP1, depending on which pair of portion sums reflects the lower overall value. Similarly, multiplexers 704M1, 704L1 receive portion sums MSP2, MSP3, and LSP2, LSP3, respectively, and are controlled by multiplexer control logic 705(2, 3)** to select the pair of portion sums MSP2, LSP2, or MSP3, LSP3, that reflects the lower overall value.

Because the addition of path metric PMx(n) and branch metric BMx(n) is split into two portions, according to this embodiment of the invention, any carry-out from the least-significant portion sum does not ripple into nor through the most-significant portion addition. As such, multiplexer control logic 705 must interpret the portion sums to determine which of the candidate pairs (MSP0, LSP0) or (MSP1, LSP1) represents the minimum value. Referring first to multiplexer control logic 705(0,1), according to this embodiment of the invention, the logic for this selection applied by multiplexer control logic 705(0,1) is illustrated in FIG. 8*a*.

Figures 8A, 8B:
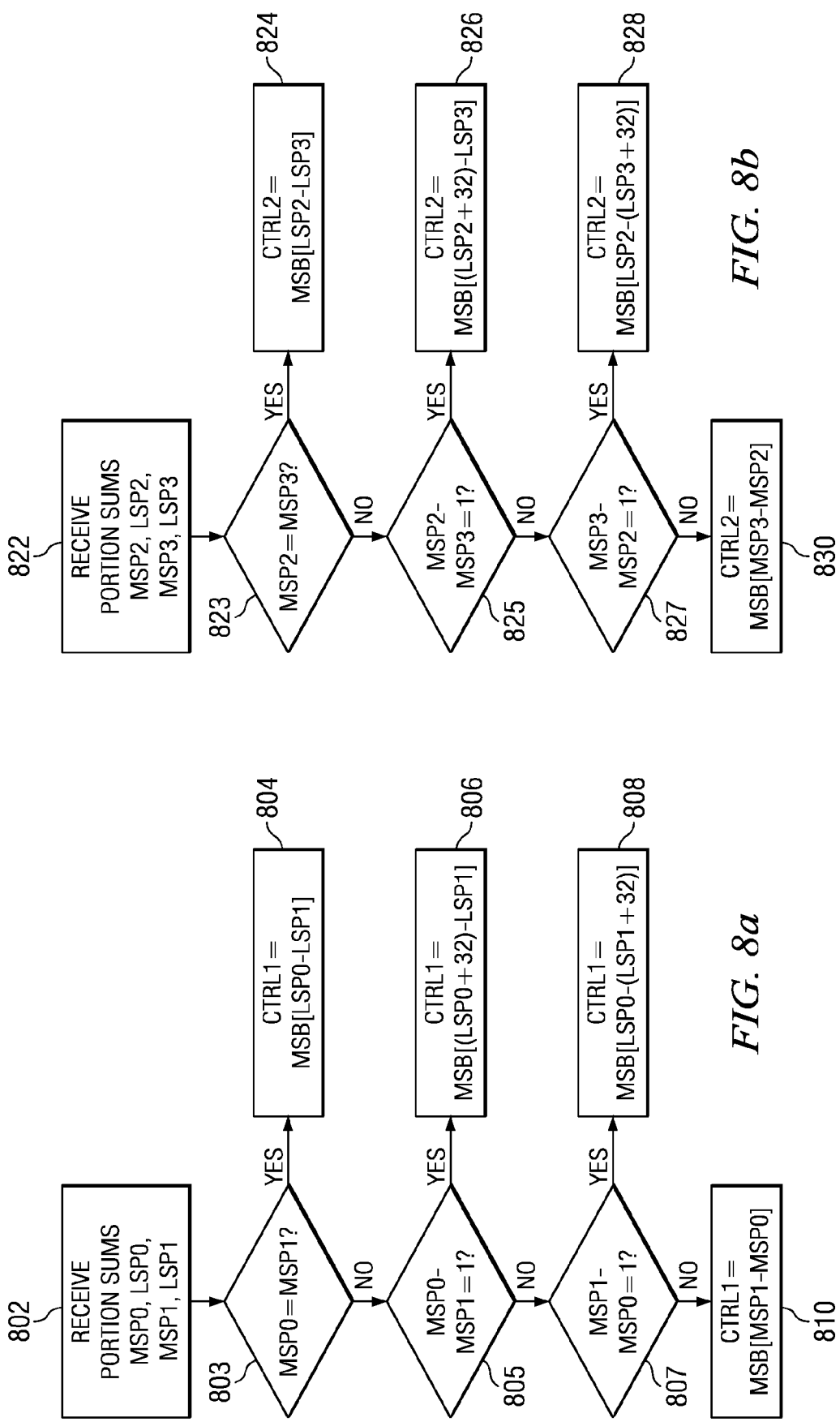
FIGS. 8*a* through 8*c* are flow diagrams illustrating the logic flow of multiplexer control logic circuits in the add-compare-select circuit of FIG. 7 according to that embodiment of the invention.

This logic flow illustrated in FIG. 8*a* corresponds to a specific example in which multiplexer control logic 705(0,1) issues a single control signal CTRL1 in common to both of multiplexers 704M0, 704L0, assuming that multiplexers 704M0, 704L0 select portion sums MSP0 and LSP0, respectively, for a "1" value of control signal CTRL1, and select portion sums MSP1, LSP1, respectively, for a "0" value of control signal CTRL1. As noted above, the task of multiplexer control logic 705(0,1) in this embodiment of the invention is to determine which of the candidate sum pairs (MSP0, LSP0), or (MSP1, LSP1), represents the lesser value. The specific logic used in any realization of this embodiment of the invention is not of importance; as such the logic flow of FIG. 8*a* is presented by way of example only.

In this example, multiplexer control logic 705(0,1) operates by receiving portion sums MSP0, LSP0, MSP1, LSP1, in process 802. Those portion sums MSP0, LSP0, MSP1, LSP1, and indeed all binary values operated upon by add-compare-select stage 700, are expressed in two's-complement form. In decision 803, multiplexer control logic 705(0,1) determines whether most-significant portion sums MSP0, MSP1 are equal to one another. If so (decision 803 is "yes"), the values of least-significant portion sums LSP0, LSP1 will determine the result. Process 804 thus sets the value of control signal CTRL1 to the most-significant bit of the difference LSP0−LSP1. As known in the art, in two's complement arithmetic, the most-significant bit indicates the sign of the value. As such, if the value of portion sum LSP1 is greater than that of portion sum LSP0, control signal CTRL1 will be a "1" (indicating a negative value difference), and multiplexers 704M0, 704L0 will select MSP0 and LSP0, respectively; conversely, if the value of portion sum LSP0 is greater than that of portion sum LSP1, control signal CTRL1 will be set to "0" and multiplexers 704M0, 704L0 will select MSP1 and LSP1, respectively. A default selection may be made if the two values are exactly equal, as either pair is suitable for selection in that case.

If decision 803 is "no", control passes to decision 805. In decision 805, multiplexer control logic 705(0,1) determines whether the difference MSP0−MSP1 has a value of +1. In this embodiment of the invention, as noted above, the addition of the path metrics and branch metrics are broken into two portions. As such, if the most-significant portion sums differ by only one, a comparison of only the most-significant portion sums cannot conclusively determine which of the two full sums has a lesser value. This is because a carry out from a least-significant portion sum will affect the value of its associated most-significant portion sum. A "yes" result from decision 805 thus indicates whether this difference-by-one case is present, with portion sum MSP0 being greater than portion sum MSP1 by one. In this case, (decision 805 is "yes"), process 806 derives the value of control signal CTRL1 by adding the "1" from the least-significant bit of most-significant portion sum MSP0 to least-significant portion sum LSP0 (reflecting the difference determined in decision 805), and then comparing this value to the current value of least-significant portion sum LSP1. Control signal CTRL1 is set to the most-significant bit (indicating sign) of this difference. In this example, in which least-significant portion sums LSP0, LSP1 are six-bit values, process 806 adds the value $32_{10}=10\ 0000_2$ to least-significant portion sum LSP0, and subtracts that sum from the value of least-significant portion sum LSP1.

If portion sum MSP0 is not greater than portion sum MSP1 by one (decision 805 is "no"), then a similar analysis is carried out by decision 807, which determines whether portion sum MSP1 is greater than portion sum MSP0 by +1. If so (decision 807 is "yes"), process 808 is performed to derive the value of control signal CTRL1 as the most-significant bit of the difference result of portion sum LSP0 minus the sum of portion sum LSP1 with a "1" from the least-significant bit of most-significant portion sum MSP1.

If the values of most-significant portion sums MSP0, MSP1 are not equal to one another, or within one of each other (decision 807 is "no"), then multiplexer control logic 705(0, 1) can conclusively determine which of most-significant portion sums MSP0, MSP1 is the lesser from the values of most-significant portion sums MSP0, MSP1 themselves. Process 810 is then performed to derive the value of control signal CTRL1 from the most-significant bit of the difference of portion sum MSP1 minus portion sum MSP0.

As noted above, the value of control signal CTRL1 determines the selections made by multiplexers 704M0, 704L0, with a "1" value selecting portion sums MSP0 and LSP0, respectively, and a "0" value selecting portion sums MSP1 and LSP1, respectively. The selected portion sums MSPx, LSPx are then forwarded by multiplexers 704M0, 704L0 on lines SMSP0, SLSP0 to inputs of multiplexers 706M, 706L, respectively.

Multiplexer control logic 705(2,3) controls the selections made by multiplexers 704M1, 704L1, via control signal CTRL2, in similar fashion as described above relative to multiplexer control logic 705(0,1). FIG. 8b illustrates the logic flow implemented by multiplexer control logic 705(2,3) in this regard; that logic flow is similar to that of FIG. 8a, with the selections of course made based on the values of portion sums MSP2, LSP2, MSP3, LSP3, which are received in process 822 (FIG. 8b). Decision 823 determines whether most-significant portion sums MSP2, MSP3 are equal; if so (decision 823 is "yes"), control signal CTRL2 is set to the most-significant bit of the difference of least-significant portion sum LSP2 minus portion sum LSP3, in process 824. If the two most-significant portion sums MSP2, MSP3 are not equal (decision 823 is "no"), decision 825 determines whether portion sum MSP2 is greater than portion sum MSP3 by one. If so (decision 825 is "yes"), process 826 sets control signal CTRL2 to the most-significant bit of the difference of the sum of portion sum LSP2 plus $32_{10}$ (in this example, which corresponds to the value of a "1" in the least-significant bit in the most-significant portion sum MSP2), minus portion sum LSP3. Conversely, if decision 825 is "no", decision 827 determines whether portion sum MSP3 is greater than portion sum MSP2 by one; if so (decision 827 is "yes"), process 828 sets control signal CTRL2 to the most-significant bit of the difference of portion sum LSP2 minus the sum of portion sum LSP3 plus $32_{10}$. Finally, if most-significant portion sums MSP2, MSP3 are not equal nor differ from one another by one (decision 827 is "no"), process 830 sets control signal CTRL2 to the most-significant bit of the difference of portion sum MSP3 minus portion sum MSP2.

Similarly as before, the value of control signal CTRL2 determines the selections made by multiplexers 704M1, 704L1, with a "1" value selecting portion sums MSP2 and LSP2, respectively, and a "0" value selecting portion sums MSP3 and LSP3, respectively. The selected portion sums MSPx, LSPx are then forwarded by multiplexers 704M1, 704L1 on lines SMSP1, SLSP1 to inputs of multiplexers 706M, 706L, respectively.

Figure 8C:
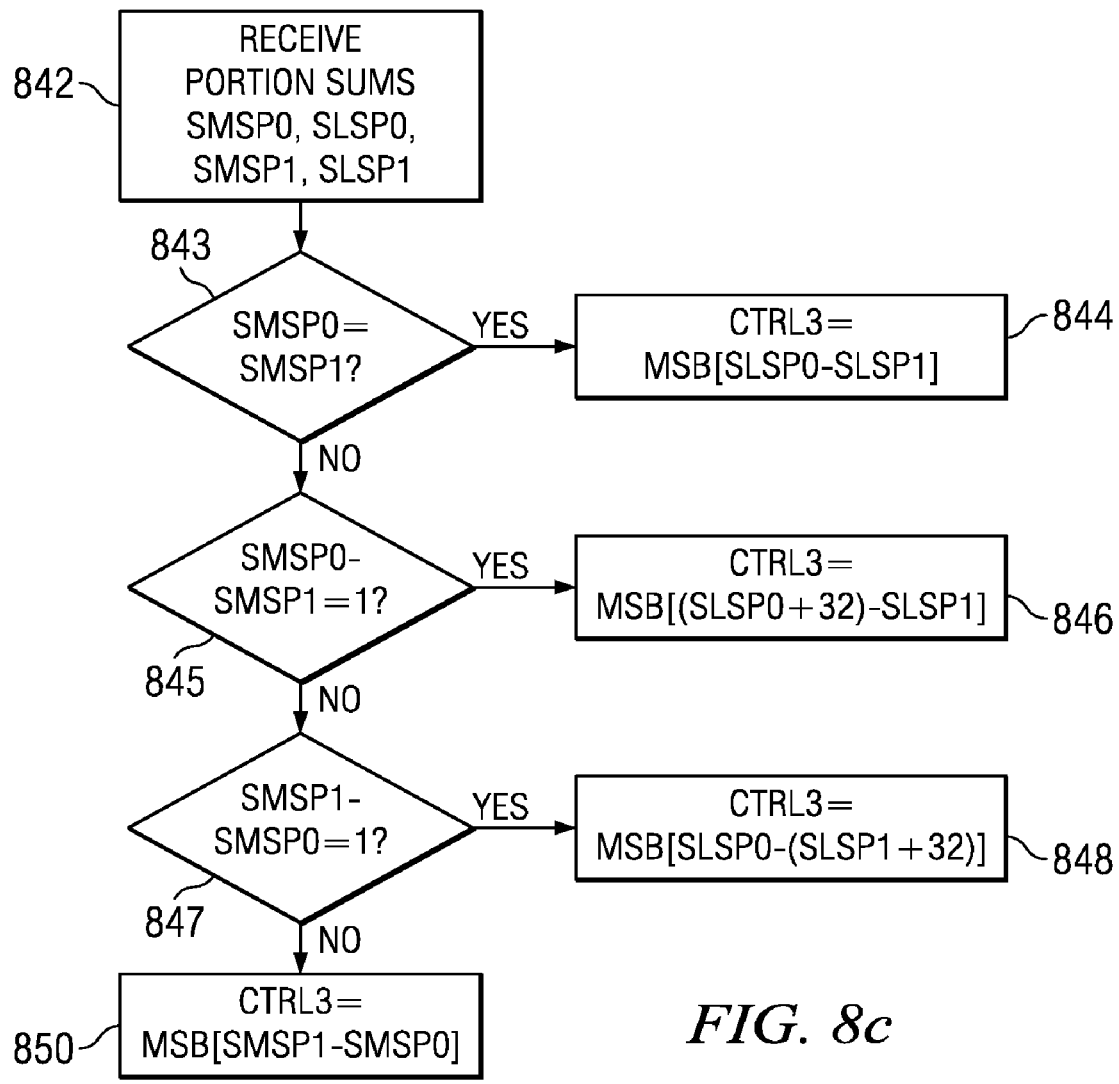

As described above and as shown in FIG. 7, multiplexer 706M receives selected most-significant portion sums SMSP0, SMSP1 from the outputs of multiplexers 704M0 and 704M1, respectively; multiplexer 706L receives selected least-significant portion sums SLSP0, SLSP1 from the outputs of multiplexers 704L0, 704L1, respectively. In addition, selected portion sums SMSP0, SLSP0, SMSP1, SLSP1 are forwarded to multiplexer control logic 707, which operates in similar manner as multiplexer control logic 705(0,1), 705(2, 3) to select the lesser of the portion sum pairs via control signal CTRL3. FIG. 8c illustrates the logic flow implemented by multiplexer control logic 707, in this embodiment of the invention. As evident from FIG. 8c, as will now be described, the process of determining which of portion sum pairs (SMSP0, SLSP0) and (SMSP1, SLSP1) represents the lesser value, and thus represents the minimum sum of path metrics and branch metrics, follows substantially the same approach as described above relative to FIGS. 8a and 8b.

The logic flow of FIG. 8c implemented by multiplexer control logic 707 begins in process 842, with the receipt of portion sums SMSP2, SLSP2, SMSP3, SLSP3. Decision 843 determines whether selected most-significant portion sums SMSP0, SMSP1 are equal; if so (decision 843 is "yes"), control signal CTRL3 is set to the most-significant bit of the difference of selected least-significant portion sum SLSP0 minus portion sum SLSP1, in process 844. If the two selected most-significant portion sums SMSP0, SMSP1 are not equal (decision 843 is "no"), decision 845 determines whether selected portion sum SMSP0 is greater than selected portion sum SMSP1 by one. If so (decision 845 is "yes"), process 846 sets control signal CTRL3 to the most-significant bit of the difference of the sum of selected portion sum SLSP0 plus $32_{10}$ (in this example, as before) minus selected portion sum SLSP1. Conversely, if decision 845 is "no", decision 847 determines whether selected portion sum SMSP1 is greater than selected portion sum SMSP0 by one; if so (decision 847 is "yes"), process 848 sets control signal CTRL3 to the most-significant bit of the difference of selected portion sum LSP0 minus the sum of selected portion sum LSP1 plus $32_{10}$. Finally, if selected most-significant portion sums SMSP0, SMSP1 are neither equal nor differ from one another by one (decision 847 is "no"), process 850 sets control signal CTRL3 to the most-significant bit of the difference of selected portion sum SMSP1 minus selected portion sum SMSP0.

Referring back to FIG. 7, the values output by multiplexers 706M, 706L together represent the minimum of the four sums of each of path metrics PM0 through PM3 plus its corresponding branch metric BM0 through BM3. These values express path metric PM(n+1), in the form of two portions and an intermediate carry-out bit. Specifically, for this example, this path metric PM(n+1) is expressed as a most-significant four-bit path metric portion PM[8:5], a least-significant five bit path metric portion PM[4:0], and an intermediate carry-out bit c from the most significant bit output by multiplexer 706L (which in this example presents a six-bit output, as described above). As evident from FIG. 7, the portions according to which path metric PM(n+1) is presented by multiplexers 706M, 706L exactly matches the form in which path metric portions are presented to adders 702. Accordingly, path metric PM(n+1) produced by add-compare-select stage 700 according to this embodiment of the invention is ready for the next radix-4 Viterbi decode operation, for the next time interval n+2. In a Viterbi decoder arrangement such as the conventional decoder of FIG. 1, this path metric PM(n+1) can also be stored in the latch, with the path selection history stored in SMU 104.

The add-compare-select stage of this embodiment of the invention provides important advantages relative to conventional add-compare-select circuits. The splitting of addends and of addition of the metric values into two portions substantially reduces the propagation delay of the overall circuit, by reducing the maximum propagation delay encountered in the addition of the metrics. For example, a nine-bit path metric value, in radix-4 Viterbi decoding implemented according to conventional architectures, would require a propagation delay dominated by the delay in adding nine-bit values, which as discussed above, has a total delay of nineteen full adder stages plus two multiplexer delays. According to this embodiment of the invention, however, this nine-bit path metric value can be combined with its branch metric by way of adders and logic in which the longest propagation delay is five full adder stages. The architecture according to this embodiment of the invention thus involve a delay of five adder stages plus two multiplexer delays. The reduced propagation delay provided by this invention is especially substantial if one considers the large number of Viterbi decoding iterations that must be calculated in modern communications. As a result, this embodiment of the invention enables substantially higher decoder throughput for a given operating clock frequency, or alternatively low power consumption to achieve a given throughput rate, depending upon the tradeoff selected by the designer.

This performance improvement is attained, through this embodiment of the invention, without involving a substantial increase in the circuit or computational complexity. For example, a conventional radix-4 add-compare-select architecture involves seven nine-bit adders and three nine-bit multiplexers. According to this embodiment of the invention, this radix-4 add-compare-select stage would require four four-bit adders, four five-bit adders, three four-bit multiplexers and three six-bit multiplexers, along with three instances of multiplexer control logic. It is contemplated that the complexity required for this embodiment of the invention is not substantially increased, if at all, relative to the conventional architecture. As such, substantial power or performance efficiency improvement can be readily attained, at a minimal cost of additional circuit complexity.

In addition to being applicable in Viterbi decoders, add-compare-select circuit of this embodiment of the invention described above relative to FIG. 7 is also applicable to turbo decoders, which are also commonly implemented as trellis stages, as discussed above. As known in the art and as summarized above relative to FIG. 3b through 3d, conventional turbo decoding involves the selection of the maximum of candidate sums, rather than the selection of a minimum sum as in the Viterbi decoding example described above. It is contemplated that those skilled in the art having reference to this specification will be readily able to implement the add-compare-select circuit or stage of this invention in turbo decoders, as well as in other decoding and system functions in which such calculations and determinations are useful.

It is contemplated that many variations to the architecture of the preferred embodiment of the invention can be realized by those skilled in the art having reference to this specification. For example, this embodiment of the invention describes an example in which the addends and sums are split into relatively equal-sized portions (differing by at most one bit), with at least one bit from each addend appearing in each portion, because it is contemplated that this equal split will maximize the performance improvement. However, it is also contemplated that other not-as-equal splitting of the addends and sums, and indeed the splitting of the addends and sums into more than two portions, also take advantage of, and are thus within the scope of, this invention.

In addition, while these embodiments of the invention are illustrated in connection with a particular radix value of a given decoder block (e.g., radix-4 for the example of FIG. 7), it is contemplated that those skilled in the art having reference to this specification will be readily able to realize this invention in other block sizes. For example, the embodiment of the invention described above relative to FIG. 7 could readily be implemented in connection with a radix-2 add-compare-select circuit by way of four adders 702 and two multiplexers 704; or as a radix-8 add-compare-select circuit by way of sixteen adders 702, eight multiplexers 704, four multiplexers 706, and two additional multiplexers receiving the outputs of multiplexers 706. Furthermore, while one or more of these embodiments of the invention are described in connection with selecting a minimum path and branch metric sum, it is contemplated that those skilled in the art having reference to this specification will be readily able to realize this invention in decoders in which the selected sum is a maximum path and branch metric sum.

These and other alternative implementations and applications of this embodiment of the invention are expected to become apparent to those skilled in the art having reference to this specification, and are intended to be within the scope of the claims hereinafter presented.

While this invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A high speed add-compare-select circuit comprising:
a plurality of path metrics;
a plurality of branch metrics, each branch metric associated with one of the plurality of path metrics;
a first plurality of adders configured to add a plurality of distinct metrics and generate a plurality of outputs therefrom, wherein the first plurality of adders are arranged in pairs, each pair of adders associating with a path metric and its associated branch metric, and each pair of adders comprising:
a first adder for generating a sum of a most significant portion of a path metric, a most significant portion of an associated branch metric, and a carry-in bit; and
a second adder for generating a sum of a least significant portion of the path metric and a least significant portion of the associated branch metric; and
comparing logic coupled to the outputs of the first plurality of adders, for generating selector control signals in response to the plurality of outputs; and
selector circuitry configured to generate the next path metric in response to the at least one path metric and further in response to the plurality of outputs.

2. The high-speed add-compare-select circuit of claim 1, wherein the carry-in bit corresponds to a carry-out value from a least-significant portion of a path metric from a previous time interval.

3. A high speed add-compare-select circuit comprising:
a first plurality of adders configured to add a plurality of distinct metrics and generate a plurality of outputs therefrom;
comparing logic coupled to the outputs of the first plurality of adders, for generating selector control signals in response to the plurality of outputs; and
selector circuitry configured to generate the next path metric in response to the at least one path metric and further in response to the plurality of outputs;
a plurality of path metrics;
a plurality of branch metrics, each branch metric associated with one of the plurality of path metrics, wherein the path metrics and branch metrics are expressed by multiple-bit values;
wherein the number of bits expressing path metrics being equal to or greater than the number of bits expressing the branch metrics;
and wherein the most significant portion and least significant portion of the path metrics differ in size from one another by at most one bit.

4. A high speed add-compare-select circuit comprising:
a first plurality of adders configured to add a plurality of distinct metrics and generate a plurality of outputs therefrom;
comparing logic coupled to the outputs of the first plurality of adders, for generating selector control signals in response to the plurality of outputs;
wherein the comparing logic comprises:
a first logic function for generating selector control signals applied to the control inputs of the first plurality of multiplexers, responsive to the outputs of the first plurality of adders; and
a second logic function for generating selector control signals applied to the control input of the second multiplexer, responsive to the outputs of the first plurality of multiplexers; and
selector circuitry configured to generate the next path metric in response to the at least one path metric and further in response to the plurality of outputs,
wherein the selector circuitry comprises:
a first plurality of multiplexers, each having inputs coupled to outputs of the first plurality of adders and having a control input; and
a second multiplexer having inputs coupled to outputs of the first plurality of multiplexers and having a control input.

5. A high speed add-compare-select circuit comprising:
a first plurality of adders configured to add a plurality of distinct metrics and generate a plurality of outputs therefrom;
comparing logic coupled to the outputs of the first plurality of adders, for generating selector control signals in response to the plurality of outputs;
wherein the comparing logic comprises:
a first logic function for generating selector control signals applied to the control inputs of the first plurality of multiplexers, responsive to the outputs of the first plurality of adders; and
a second logic function for generating selector control signals applied to the control inputs of the second plurality of multiplexers, responsive to the outputs of the first plurality of multiplexers; and
selector circuitry configured to generate the next path metric in response to the at least one path metric and further in response to the plurality of outputs,
wherein the selector circuitry comprises:
a first plurality of multiplexers, each having inputs coupled to outputs of the first plurality of adders and having a control input; and
a second plurality of multiplexers, each having inputs coupled to outputs of the first plurality of multiplexers and having a control input.

6. The high speed add-compare-select circuit of claim 5, wherein the first plurality of multiplexers comprises:
a first multiplexer having a first input coupled to the output of a first adder of a first pair of adders, and having a second input coupled to the output of a first adder of a second pair of adders;
a second multiplexer having a first input coupled to the output of a second adder of the first pair of adders, and having a second input coupled to the output of a second adder of the second pair of adders;
a third multiplexer having a first input coupled to the output of a first adder of a third pair of adders, and having a second input coupled to the output of a first adder of a fourth pair of adders; and
a second multiplexer having a first input coupled to the output of a second adder of the third pair of adders, and having a second input coupled to the output of a second adder of the fourth pair of adders;
and wherein the second plurality of multiplexers comprises:
a fifth multiplexer having a first input coupled to the output of the first multiplexer and a second input coupled to the output of the second multiplexer; and
a sixth multiplexer having a first input coupled to the output of the third multiplexer and a second input coupled to the output of the fourth multiplexer.

* * * * *